(12) United States Patent
Yamada

(10) Patent No.: US 6,215,728 B1
(45) Date of Patent: Apr. 10, 2001

(54) DATA STORAGE DEVICE CAPABLE OF STORING PLURAL BITS OF DATA

(76) Inventor: Kunihiro Yamada, 483-2 River-Haitsu II #103, Shiboguchi, Takatsu-ku, Kawasaki 213-0023 (JP)

( * ) Notice: Subject to any disclaimer, the term of this patent is extended or adjusted under 35 U.S.C. 154(b) by 0 days.

(21) Appl. No.: 09/577,581

(22) Filed: May 25, 2000

(30) Foreign Application Priority Data

Jun. 29, 1999 (JP) .................................................. 11-182848

(51) Int. Cl.[7] ...................................................... G11C 8/04
(52) U.S. Cl. ...................... 365/233.5; 365/233; 365/168; 365/230.06; 365/189.12; 365/78
(58) Field of Search .................................. 365/78, 189.12, 365/239, 240, 233, 168, 230.06, 233.5

(56) References Cited

U.S. PATENT DOCUMENTS 5,448,524 * 9/1995 Machida ........................... 365/189.12
5,912,859 * 6/1999 Wuidart .................................. 365/233

* cited by examiner

*Primary Examiner*—Andrew Q. Tran
(74) *Attorney, Agent, or Firm*—Kanesaka & Takeuchi

(57) ABSTRACT

Disclosed is a data storage device capable of storing plural bits of data using one storage circuit which can hold two signal levels. The data storage device storing the plural bits of data comprises a clock generating section for generating a reference clock signal having predetermined reference cycles and at least one divided clock signal having a cycle which is $(1/2)^n$ (n: natural number) times the reference cycle; decoding sections for selecting any one of periods, based on contents of data inputted thereto, among a plurality of periods at which a signal level of the divided clock signal is constant at one of the reference cycles; a storage section for starting to generate cyclic pulses having the same cycle as the reference cycle at a predetermined timing as a trigger timing, the predetermined timing being within the selected period by the decoding sections; and an output section for specifying output data based on a signal level of the reference clock signal at the same phase timing as the trigger timing in terms of a cycle of the pulses and a signal level of the divided clock signal in the phase timing.

5 Claims, 4 Drawing Sheets

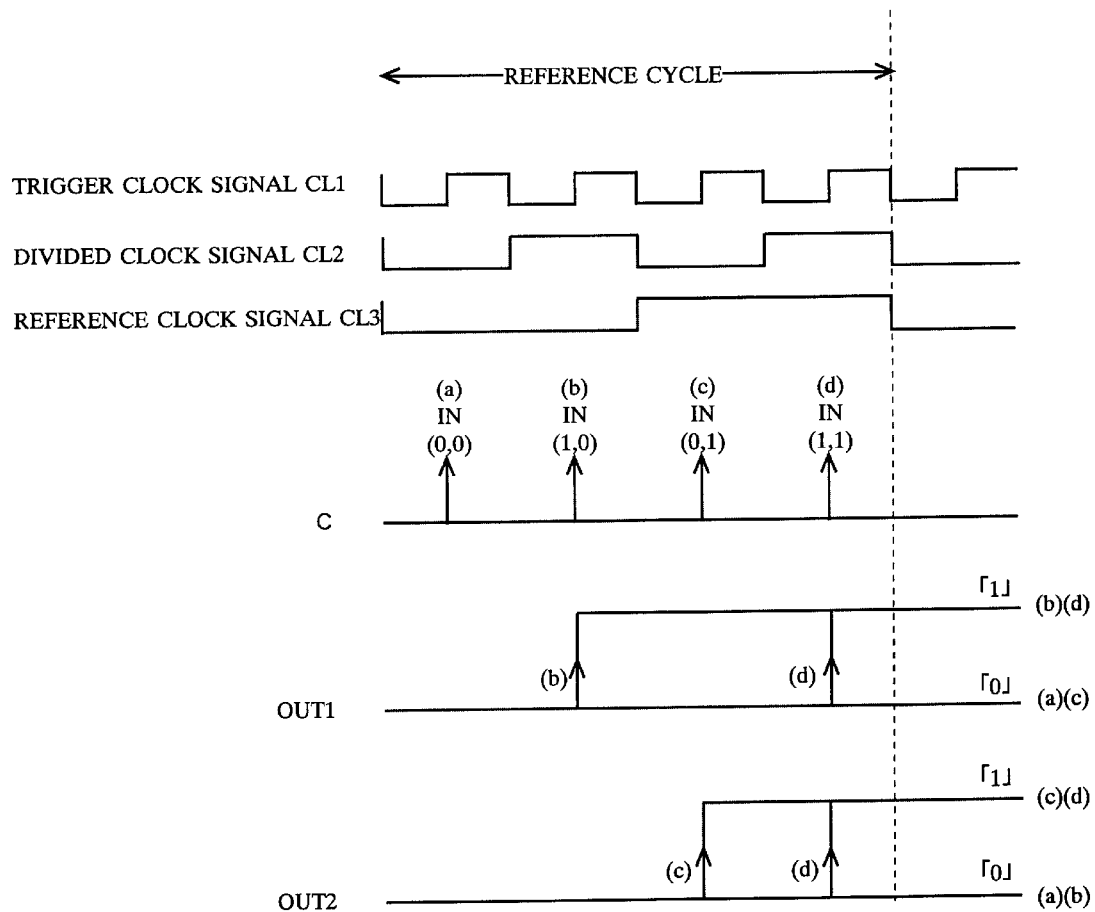
F I G. 3

DATA STORAGE DEVICE CAPABLE OF STORING PLURAL BITS OF DATA

BACKGROUND OF THE INVENTION

1. Field of the Invention

The present invention relates to a data storage device which stores data composed of a plurality of bits.

2. Description of the Related Art

Various kinds of data storage devices including also a data holding circuit such as a latch circuit which temporarily stores data have been proposed and put to practical use. However, most of these data storage devices stores one bit data by one storage element or one storage device. For example, in a D-type flip-flop, a signal level indicating a level "H" or a level "L" at a D input terminal is stored by applying clocks thereto. If the level "H" or the level "L" is being inputted to the D input terminal at a certain timing of rising up edges of the clocks, the level "H" or the level "L" is outputted from a Q-output terminal, and until a next timing of the rising up edge of the clocks, an output level at the Q-terminal is kept at the level "H" or the level "L" that is being outputted. As described above, one flip-flop can output only the two signal levels "H" or "L". Accordingly, by corresponding the two signal levels to "1" or "0", one bit data is stored in one storage circuit.

SUMMARY OF THE INVENTION

The object of the present invention is to provide a data storage device which uses one storage circuit capable of taking two signal levels and can store plural bits of data.

To solve the above-described problems, a data storage device of the present invention storing plural bits of data comprises clock generating means for generating a reference clock signal having a predetermined reference cycle and at least one divided clock signal having a cycle $(½)^n$ (n: natural number) times the reference cycle; decoding means for selecting one of periods, based on contents of data inputted thereto, the periods being obtained by dividing the reference cycle and within each of which a signal level of the divided clock signal keeps constant; storage means for generating a cyclic pulse having the same cycle as the reference cycle and for starting to generate the cyclic pulse as a trigger timing, the trigger timing being a predetermined timing within one period selected by the decoding means; and output means for specifying output data based on a signal level of the reference clock signal and a signal level of the divided clock signal at the same phase timing as the trigger timing in terms of a cycle of the cyclic pulse.

In the data storage device which stores n bit data (n≧2), it is preferable that the clock generating means generates (n−1) pieces of the divided clock signals having different cycles.

The clock generating means may further generate a trigger clock signal obtained by dividing the above-described divided clock signal having the minimum cycle, and the storage means may be a single-shot type flip-flop which generates the cyclic pulse at a timing within one period selected by the decoding means, the timing being when the signal level of the trigger clock signal changes.

As the above-described storage means, an oscillation circuit may be used, which generates the cyclic pulse having the same cycle as the reference cycle at a predetermined timing in one period selected by the decoding means.

Furthermore, a plurality of D-type flip-flops can be used as the output means. In this case, cyclic pulses generated in the storage means are commonly supplied to clock input terminals of the respective D-type flip-flops. The reference clock signal is supplied to a D-input terminal of one of the D-type flip-fops. Furthermore, the divided clock signal is supplied to D-input terminals of other D-type flip-flops.

With such constitution, the reference cycle is divided every each period within which the signal level of the divided clock signal keeps constant. The decoding means selects one of the divided periods in accordance with the content data to be stored. As a result, within a specified period, the signal level of the reference clock signal and the signal level of the divided clock signal become constant. Accordingly, each period when the signal level of each clock signal becomes constant is made to correspond to the data to be stored. The storage means generates cyclic pulses at timings (trigger timings) within the selected period. The cycle of the pulses is equivalent to the reference cycle. Accordingly, in terms of the cycle of the pulses, the signal level of the reference clock signal is always kept to be constant. That is, the signal level of the reference clock signal becomes equal to the signal level at the trigger timing. Similarly, the signal level of the divided clock signal at the same phase timing as that of the trigger pulses are always equal to each other. In other words, that the storage means generates cyclically the pulses equivalent to the reference cycle at the trigger timing corresponds to the storage of the data. If the signal level of each clock signal at its phase timing is specified, the signal level of each clock signal at the time of generation of the first pulse, that is, the stored data, can be outputted.

BRIEF DESCRIPTION OF THE DRAWINGS

For a more complete understanding of the present invention and the advantages thereof, reference is now made to the following description taken in conjunction with the accompanying drawings, in which;

FIG. 3 is a diagram for explaining a relation between two bit data and a rising up timing of one-shot pulse.

DETAILED DESCRIPTION OF THE PREFERRED EMBODIMENTS

Figure 1:
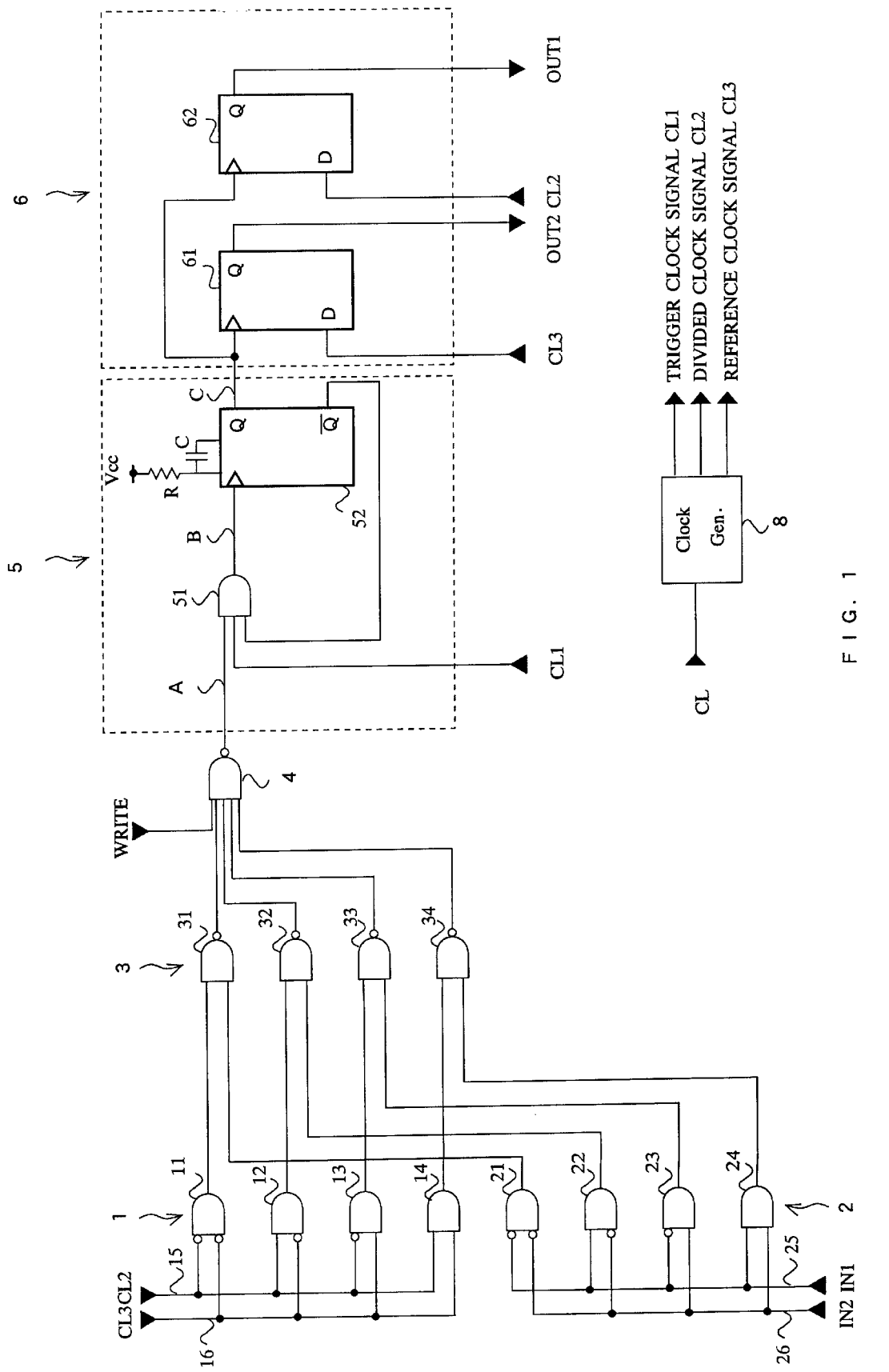
FIG. 1 is a circuit diagram of a data storage device of an embodiment.
Figure 2:
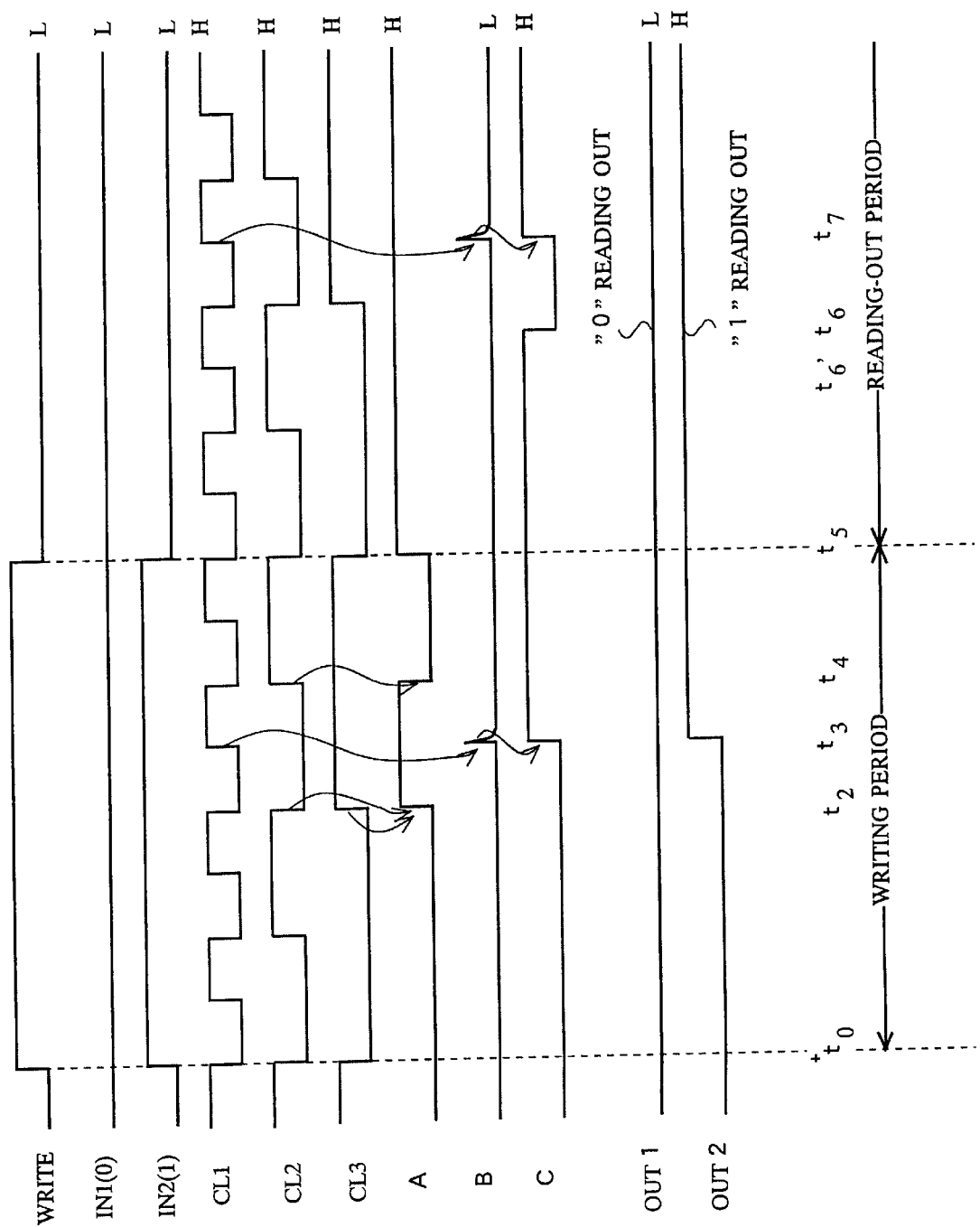
FIG. 2 is a timing chart of the data storage device shown in FIG. 1.

FIG. 1 is a circuit diagram of a data storage device according to an embodiment of the present invention. FIG. 2 is a timing chart of the data storage device shown in FIG. 1. The data storage device is basically constituted by decoding sections 1, 2 and 3 that are a two-stage decoder, a writing control section 4, a data storage section 5 and a data output section 6.

A clock decoder 1 located at a pre-stage of the two-stage decoder is constituted by four two-input AND gates 11 to 14.

A clock line 15 to which a divided clock signal CL2 is supplied is connected to one of input terminals of each of the AND gates 11 to 14. A clock line 16 to which a reference clock signal CL3 is supplied is connected to the other input terminal of each of the AND gates 11 to 14. Predetermined sets of combinations of the clock signals CL2 and CL3 are inputted to each of the AND gates 11 to 14. To be more specific, an inverted signal $\overline{CL2}$ of the divided clock signal CL2 and an inverted signal $\overline{CL3}$ of the reference clock signal CL3 are inputted to the AND gate 11. A non-inverted signal CL2 of the divided clock signal and the inverted signal $\overline{CL3}$ of the reference clock signal are inputted to the AND gate 12. The inverted signal $\overline{CL2}$ of the divided clock signal and a non-inverted signal CL3 of the reference clock signal are inputted to the AND gate 13. The non-inverted signal CL2 of the divided clock signal and the non-inverted signal CL3 of the reference clock signal are input to the AND gate 14.

The clock generating circuit 8 generates the reference clock signal CL3, the divided clock signal CL2 and a later-described trigger clock signal CL1. As shown in FIG. 2, assuming that a cycle of the reference clock signal CL3 be a reference cycle, a cycle of the divided clock signal CL2 is set to a half of the reference cycle, that is, a divided ratio of ½. Accordingly, within a period (time $t_0$ to $t_5$) corresponding to the reference cycle of the reference clock signal CL3, output levels of the AND gates 11 to 14 switch every ¼ cycle of the reference cycle in the order of the gates 11, 12, 13 and 14. The later-described trigger clock signal CL1 is set to ¼ of the reference cycle divided ratio: ¼), that is, a ½ cycle of the divided clock signal CL2.

Moreover, a data decoder 2 located in the pre-stage of the decoding section is constituted by four two-input AND gate 21 to 24. A data line 25 for transmitting a first data signal IN1 is connected to one input terminal of each of the gates 21 to 24, and a data line 26 for transmitting a second data signal IN2 is connected to the other input terminal of each of the gates 21 to 24. Predetermined sets of combinations of the data signals IN1 and IN2 are input to each of the AND gates 21 to 24. To be more specific, an inverted signal $\overline{IN1}$ of the first data signal and an inverted signal $\overline{IN2}$ of the second data signals are input to the AND gate 21. A non-inverted signal IN1 of the first data signals and the inverted signal $\overline{IN2}$ of the second data signals are inputted to the AND gate 22. The inverted signal $\overline{IN1}$ of the first data signal and the non-inverted signal IN2 of the second data signal are inputted to the AND gate 23. The non-inverted signal IN1 of the first data signals and the non-inverted signal IN2 ofthe second data signal are inputted to the AND gate 24.

On the other hand, a coincidence circuit 3 located at a rear-stage of the decoding section is constituted by four two-stage NAND gates 31 to 34. Any one of the output lines of the AND gates 11 to 14 constituting the clock decoder 1 is connected to one input terminal of each of the NAND gates 31 to 34. Any one of the output lines of the AND gates 21 to 24 constituting the data decoder 2 is connected to the other terminal of each of the NAND gates 31 to 34.

The write control section 4 is constituted by a five-input NAND gate. Output lines of the NAND gates 31 to 34 constituting the coincidence circuit 3 are connected to four input terminals of the NAND gate. A write control signal WRITE is inputted to the remaining one input terminal of the NAND gate. The write control signal WRITE is set to a level "H" only during a period for permitting a data writing to the data storage device, and set to a level "L" in other periods including that for a data reading out.

The data storage section 5 is composed of a three-input AND gate 51 and a single-shot type flip-flop 52. To three input terminals of the AND gate 51, inputted are an output signal A of the write control section 4, the trigger clock signal CL1, and an inverted output signal $\overline{Q}$ of the single-shot type flip-flop 52. As described above, a cycle of the trigger clock signal CL3 is set to ½ of the cycle of the divided clock signal CL2, that is, ¼ of the cycle of the reference clock signal CL3. Moreover, an output signal B of the AND gate 51 is inputted to the single-shot type flip-flop 52. When the output signal B of the AND gate 51 is inputted to the single-shot type flip-flop 52 as the input trigger signal, the flip-flop 52 outputs pulses having a pulse width which is set by a resistor R and a capacitor C, which are provided outside the single-shot type flip-flop 52. Rising-up timings of the output pulses are determined by the rising-up edge of the input trigger signal, and the pulse width is always constant.

The data output section 6 is composed of two D-type flip-flops (data flip-flops) 61 and 62. An output signal of the data storage section 5, that is, an output signal C from a Q-output terminal of the single-shot type flip-flop 52, is inputted in parallel to clock input terminals of the D-type flip-flops 61 and 62. The reference clock signal CL3 is inputted to the D-input terminal of the D-type flip-flop 61, and second output data OUT2, which corresponds to the second input data IN2, is output from a Q-output terminal thereof. The divided clock signal CL2 is inputted to a D-input terminal of the D-type flip-flop 62, and first output data OUT1, which corresponds to the first input data IN1, is outputted from a Q-output data thereof. The D-type flip-flops 61 and 62 output signal levels of the D-input terminals (that is, states of the trigger clock signal CL2 and the reference clock signal CL3) at the rising-up timing of the output signal C supplied to the clock input terminals, and hold these signal levels.

The data storage device having such constitution can perform writing/reading-out of two-bit data using one single-shot type flip-flop 52. In other words, this data storage device can store two-bit input data IN1 and IN2, and outputs these input data as output data OUT1 and OUT2. The detail of the data writing/reading-out will be described with reference to FIG. 2 using an example in which the input data (IN1, IN2) are (0, 1) below.

In a period of time $t_0$ to $t_5$ at which the write control signal WRITE is high in level, writing of the input data is performed. When the input data (IN1, IN2) is (0, 1), only the output of the AND gate 23 in the data decoder 2 is high in level, and hence a signal offering a high level is supplied to one input terminal of the NAND gate 33. Accordingly, an output of the NAND gate 33 changes to be low in level only at the time when an output of the AND gate 13 in the clock decoder 1 is high in level. Moreover, since outputs of the AND gates 21, 22 and 24 change to be low in level, signals offering a low level are supplied to input terminals of the NAND gates 31, 32 and 34. As a result, outputs of the NAND gates 31, 32 and 34 are held to be high in level regardless of an output signal from the clock decoder 1.

The inverted signal $\overline{CL2}$ of the divided clock signal and the non-inverted signal CL3 of the reference clock signal are inputted to the AND gate 13. Accordingly, only during a period when the divided clock signal CL2 is low in level and the reference clock signal CL3 is high in level, that is, only a period from time $t_2$ to $t_4$, the AND gate 13 outputs a signal offering a high level. Thus, during this period, an output of the NAND gate 33 provided on the output terminal side of the AND gate 13 is changed to be low in level. As a result, during the period from time $t_2$ to $t_4$, the output signal A of the five-input NAND gate 4 is changed to be high in level.

The trigger clock signal CL1 and an inverted output $\overline{Q}$ of the single-shot type flip-flop 52 are further inputted to the AND gate 51 which receives the output signal A of the NAND gate 4 as an input signal. As described above, the output signal A is high in level during the period of the time $t_2$ to $t_4$. Furthermore, the trigger clock signal CL1 is high in level during the period of the time $t_3$ to $t_4$. Accordingly, the output signal B of the AND gate 51 rises up at the time $t_3$ at which the output signal A and the trigger clock signal CL1 are high in level. Note that the inverted output $\overline{Q}$ is high in level until immediately before the time $t_3$.

When the output signal B of the AND gate 51 rises up at the time $t_3$, the output signal B serves as a trigger to allow the single-shot type flip-flop 52 to generate pulses having a predetermined width (one-shot pulse), which is decided by the resistor R and the capacitor C provided outside the circuit. In the example of FIG. 2, the single-shot type flip-flop 52 is designed such that the one-shot pulse holds its rising-up state until the time $t_6$. In setting the pulse width of the one-shot pulse, that is, in setting the time $t_6$ at which the one-shot pulse drops, values of the resistor R and the capacitor C satisfying the following conditions are determined.

(Conditions)

time $t_6' <$ time $t_6 <$ time $t_7$ where $t_6'$ is the second rising-up time of the trigger clock signal CLI after the time $t_5$, and $t_7$ is the third rising-up time of the trigger clock signal CL1 after the time $t_5$.

The above-described conditions implies that the one-shot pulse is generated cyclically by the trigger clock signal CL1 and a cycle of the one-shot pulse is set to be equal to that of the reference clock signal CL3, that is, the reference cycle.

Although the details of an operation of the data storage device according to this embodiment are described later, the rising-up timing of the single-shot type flip-flop 52 is determined in accordance with contents of the input data (IN1, IN2). The output pulse from the flip-flop 52 rises up cyclically at any one selected among the four different timings. Namely, the data storage section 5 rises up cyclically at the selected timings, thus storing the contents of the two-bit input data (IN1, IN2).

When the output signal C rises up at the time $t_3$, the D-type flip-flops 61 and 62 output continuously from the Q-output terminals thereof the signal level at the D-input terminal at the rising-up timing of the output signal C. Explanations for the D-type flip-flop 61 are first made. The reference clock signal CL3 is supplied to the clock input terminal of the D-type flip-flop 61, and the signal level of the clock signal CL3 is high at the time $t_3$. The second output signal OUT2 outputted from the Q-output terminal of the D-type flip-flop 61 is kept to be high in level after the time $t_3$. The divided clock signal CL2 is being supplied to the clock input terminal of the D-type flip-flop 62, and the signal level of the clock signal CL2 is low at the time $t_3$. Accordingly, the first output signal OUT1 outputted from the Q-output terminal of the D-type flip-flop 62 is kept to be low in level after the time $t_3$. As a result, the output data (OUT1, OUT2) becomes the same data as the input data (IN1, IN2), that is, (0, 1).

When the write control signal WRITE drops at the time $t_5$, the writing period terminates, and the reading-out period starts. Since the write control signal WRITE is kept to be low in level after the time $t_5$, the output signal A of the NAND gate 4 is always kept to be high in level. Thereafter, since the signal level at the Q-output terminal of the single-shot type flip-flop 52, that is, the output signal C, drops at the time $t_6$, the inverted output $\overline{Q}$ of the output signal C becomes high in level. Then, at the time $t_7$ at which the trigger clock signal CL1 rises up immediately after the time $t_6$, the AND gate 51 generates again a trigger as the output signal B. Thus, the single-shot type flip-flop 52 generates again the one-shot pulse. The one-shot pulse is repeatedly generated in the above-described reference cycle also after the time $t_7$, similarly. The rising-up timings for each cycle including the first pulse generation timing take always the same phase relative to the reference cycle. As described above, the pulse is in synchronization with the reference clock signal CL3, the signal level of the divided clock signal CL2 at each rising-up timing is always low in level. Moreover, the signal level of the reference clock signal CL3 at each rising-up timing is always high in level. Accordingly, the data (0, 1) is continuously outputted from the D-type flip-flops 61 and 62.

In the data storage device according to this embodiment, when the data (0, 1) is given as the input data (IN1, IN2), the data storage section 5 generates cyclically the one-shot pulse at the timing specified by the content of the input data. In other words, the data storage section 5 stores the rising-up timing of the one-shot pulse. The divided clock signal CL2 is always low in level at the rising-up timing of the one-shot pulse, and the reference clock signal CL3 is always high in level. Accordingly, the D-type flip-flops 61 and 62 output continuously (0, 1) as the output data (OUT1, OUT2). In other words, the cyclic generation of the one-shot pulse at the timing at which the divided clock signal CL2 is low in level and the reference clock signal CL3 is high in level is equivalent to storing the two-bit input data (0, 1).

FIG. 3 is a diagram for explaining a relation between the two-bit data and the rising-up timing of the one-shot pulse. There are four cases in accordance with the contents of the two-bit data, as the generation timing of the one-shot pulse generated by the single-shot type flip-flop 52. First, when the input data (IN1, IN2) is (0, 0), the output signal C of the single-shot type flip-flop 52 rises up at the timing shown by (a) of FIG. 3. To be more specific, assuming that a cycle (reference cycle) of the reference clock signal CL3 be one cycle, its rising-up timing corresponds to a time at which the trigger clock signal CL1 first rises up after the start of the cycle. The output signal C in the case where the input data is (1, 0) rises up at the timing shown by (b) of FIG. 3. Specifically, this rising-up timing corresponds to a time at which the trigger clock signal CL1 rises up at the second time after the start of the cycle. In the case where the input data is (0, 1), the output signal C of the flip-flop 52 rises up at the timing shown by (c) of FIG. 3. Specifically, the rising-up timing of the output signal C corresponds to a time at which the trigger clock signal CL1 rises up at the third time after the start of the cycle. Furthermore, in the case where the input data is (1, 1), the output signal C of the flip-flop 52 rises up at the timing shown by (d) of FIG. 3. Specifically, the rising-up timing of the output signal C corresponds to a time at which the trigger clock signal CL1 rises up at the fourth time after the start of the cycle.

In the case where the one-shot pulse rises up in the case (a), the D-type flip-flop 62 having the D-input terminal to which the divided clock signal CL2 is supplied outputs continuously, as the first output signal OUT1, a signal level of the divided clock signal CL2 at the rising-up time of the one-shot pulse, that is, a low level. The D-type lip-flop 61 having the D-input terminal to which the reference clock signal CL3 is supplied continuously outputs, as the second output signal OUT2, a signal level of the reference clock signal CL3 at the rising-up timing of the one-shot pulse, that is, a low level.

In the case where the one-shot pulse rises up in the case (b), the D-type flip-flop 62 outputs a signal level of the divided clock signal CL2 at the rising-up timing of the one-shot pulse, that is, a high level. The D-type flip-flop 61 outputs a signal level of the divided clock signal CL3 at the rising-up timing of the one-shot pulse, that is, a low level.

In the case where the one-shot pulse rises up in the case (c), the D-type flip-flop 62 outputs a signal level of the divided clock signal CL2 at the rising-up timing of the one-shot pulse, that is, a low level. Furthermore, the D-type flip-flop 61 outputs a signal level of the reference clock signal CL3 at the rising-up timing of the one-shot pulse, that is, a high level.

In the case where the one-shot pulse rises up in the case (d), the D-type flip-flop 62 outputs a signal level of the divided clock signal CL2 at the rising-up timing of the one-shot pulse, that is, a high level. Furthermore, the D-type flip-flop 61 outputs a signal level of the reference clock signal CL3 at the rising-up timing of the one-shot pulse, that is, a high level.

As is understood from these four cases, the rising-up timing of the output signal C is specified to one in accordance with the contents of the input data. The D-type flip-flops 61 and 62 output the signal levels of the divided clock signal CL2 and the reference clock signal CL3 by using the rising-up timings of the output signal C as a trigger. The rising-up timings have the phase identical to each other, and the clock signals CL2 and CL3 are in the same level as that of the input data at the respective rising-up timings. Accordingly, also after the termination of the writing period, the same data as the input data can be outputted from the D-type flip-flops 61 and 62.

As described above, the data storage device according to this embodiment uses one flip-flop capable of outputting only the two signal levels, that is, a low or high level, by one, and can store the two-bit data. Accordingly, it is possible to store data of large capacitance with a comparatively small circuit size.

In this embodiment, the example in which the D-type flip-flop is used as the data output section 6 was described. However, the present invention is not limited to this example. As a matter of course, an example, in which a circuit component such as an RS flip-flop is used, is included in the scope of the present invention.

The above-described embodiment was described using the two-bit data storage device as an example. However, the present invention is not limited to this data storage device, and can be applied to a data storage device which can store data with larger number of bits. Specifically, if the larger number of clock signals are prepared and the rising-up timing of the one-shot pulse is more finely set, it is theoretically possible to store the data in one flip-flop without any upper limitation.

When three-bit data is, for example, stored, two divided clock signals taking divided ratios of ½ and ¼ relative to the reference clock signal are used. Thus, there exist eight periods during the reference clock cycle (that is, the reference cycle), in each of which the signal levels of the divided clock signals are constant. These eight periods may be allowed to correspond to the three-bit data. In this case, the trigger clock signal should be set to ½ of the trigger clock having the minimum cycle, that is, ⅛ of the reference cycle.

The above-described technical matters are generalized as follows. When n-bit data (n: natural number equal to 2 or more) is stored, one reference clock signal and (n−1) pieces of divided clock signals having different cycles from that of the reference clock signal are necessary. The cycles of the divided clock signals are $½^i$ (i=1, 2, 3, . . . (n−1)) times the reference cycle, respectively. Moreover, the cycle of the trigger clock signal is $½^n$ times the reference cycle.

Figure 4:
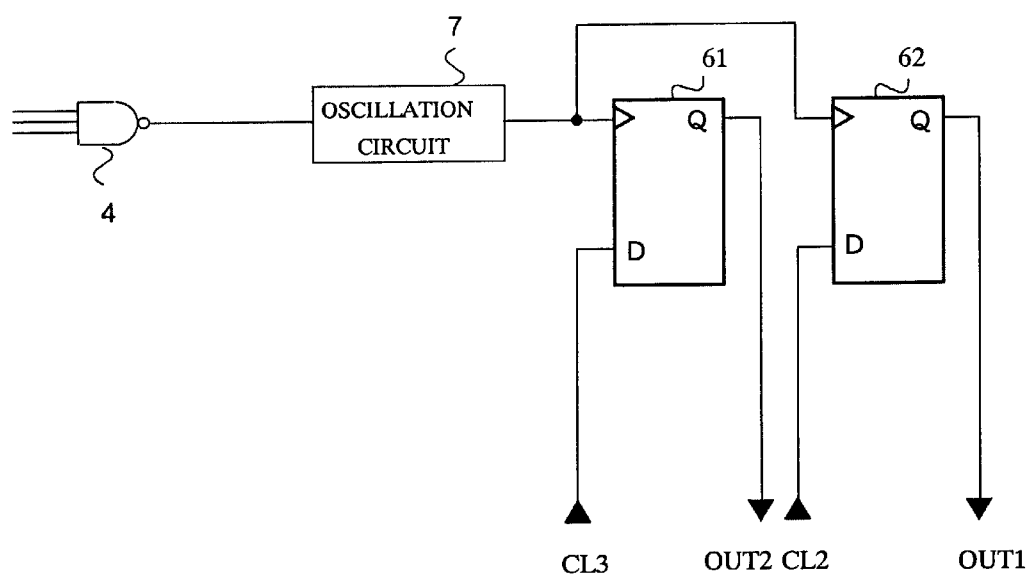
FIG. 4 is a circuit diagram showing a principal part according to a modification of the data storage device.

FIG. 4 is a circuit diagram showing a principal portion of a modification of the data storage device. The single-shot type flip-flop used in the above-described embodiment cannot generate cyclic pulses by itself. Accordingly, the single-shot flip-flop generates continuously the one-shot pulse using the trigger clock signal CL1 as a trigger. Contrary to this, the data storage device according to this modification uses, instead of the single-shot type flip-flop 52, an oscillation circuit 7 which generates cyclically pulses having a predetermined width. Note that the same circuit components as those shown in FIG. 1 are denoted by the same reference numerals and descriptions for them are omitted.

The cycle of pulse generated by the oscillation circuit 7 is set to be equal to that of the reference clock signal CL3, and generation of the pulse is begun at a timing delayed by a predetermined time from a rising-up of a NAND gate 4 which serves as a write control section. It is necessary that a cycle of the pulse generated is made to be always coincident with the cycle of the reference clock signal CL3. This is because if there are somewhat errors between these cycles, the errors are accumulated and erroneous output data are outputted. Accordingly, as a countermeasure for occurrence of such situation, a correction circuit which repeatedly sets a synchronous timing of the generated pulse and the reference clock signal at intervals of a certain period may be effectively provided.

In the data storage device according to the above-described modification, the oscillation circuit 7 can generate cyclically the pulse by itself, and hence it is unnecessary to provide the trigger clock signal CL1 as described above. Accordingly, the clock generation circuit and the like can be simplified.

According to the present invention, a large number of bit data can be stored with one storage circuit.

Although the preferred embodiment of the present invention has been described in detail, it should be understood that various changes, substitutions and alternations can be made therein without departing from spirit and scope of the inventions as defined by the appended claims.

What is claimed is:

1. A data storage device which stores plural bits of data, comprising:

clock generating means for generating a reference clock signal having a predetermined reference cycle and at least one divided clock signal having a cycle which is $(1/2)^n$ (n: natural number) times said reference cycle;

decoding means for selecting one of periods, based on contents of data inputted thereto, said periods being obtained by dividing said reference cycle and in each of which a signal level of said divided clock signal is constant;

storage means for generating a cyclic pulse having the same cycle as said reference cycle, and for starting to generate said cyclic pulse at a trigger timing, said trigger timing being a predetermined timing within the period selected by said decoding means; and output means for specifying output data based on a signal level of said reference clock signal and a signal level of said divided clock signal at the same phase timing as said trigger timing in terms of a cycle of said cyclic pulse.

2. The data storage device according to claim 1, wherein said data storage device stores n bit (n≧2) data and said clock generating means generates said divided clock signals of (n−1) pieces, each of said divided clock signals having a different cycle from each other.

3. The data storage device according to claim 1, wherein said clock generating means further generates a trigger clock signal obtained by dividing said divided clock signal having the minimum cycle, and said storage means is a single-shot type flip-flop which generates said cyclic pulse at a timing at which the signal level of said trigger clock signal changes within the period selected by said decoding means.

4. The data storage device according to claim 1, wherein said storage means is an oscillation circuit which generates said cyclic pulse having the same cycle as said reference cycle, at a predetermined timing within the period selected by said decoding means.

5. The data storage device according to claim 1, wherein said output means is composed of a plurality of D-type flip-flops, said cyclic pulse generated by said storage means are supplied in common to clock input terminals of said D-type flip-flops, said reference clock signal is supplied to a D-input terminal of one of said D-type flip-flops, and said divided clock signal is supplied to a D-input terminal of the other of said D-type flip-flops.

* * * * *